United States Patent
Morgan et al.

(10) Patent No.: US 7,012,467 B2
(45) Date of Patent: Mar. 14, 2006

(54) APPARATUS AND METHOD FOR COMPENSATING OPERATING CURRENT IN AN AMPLIFIER WHEN SUPPLY VOLTAGE VARIES

(75) Inventors: Mark W. Morgan, Allen, TX (US); Yanli Fan, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 142 days.

(21) Appl. No.: 10/796,954

(22) Filed: Mar. 10, 2004

(65) Prior Publication Data
US 2005/0200414 A1    Sep. 15, 2005

(51) Int. Cl.
*H03F 3/45* (2006.01)
(52) U.S. Cl. .................. 330/261; 330/273; 330/296
(58) Field of Classification Search .............. 330/261, 330/273, 296
See application file for complete search history.

(56) References Cited

U.S. PATENT DOCUMENTS

| 5,347,224 A | * | 9/1994 | Brokaw | 324/522 |
| 5,640,122 A | * | 6/1997 | McClure | 327/530 |
| 5,793,194 A | * | 8/1998 | Lewis | 323/312 |
| 6,051,999 A | * | 4/2000 | To et al. | 327/66 |
| 6,211,661 B1 | * | 4/2001 | Eckhardt | 323/316 |
| 6,262,616 B1 | * | 7/2001 | Srinivasan et al. | 327/264 |

* cited by examiner

*Primary Examiner*—Patricia Nguyen
(74) *Attorney, Agent, or Firm*—W. Daniel Swayze, Jr.; W. James Brady; Frederick J. Telecky, Jr.

(57) ABSTRACT

An apparatus for compensating operating current in an amplifier device when supply voltage to the amplifier device decreases below a predetermined value at an input voltage supply locus includes: (a) A first control circuit coupled with the input voltage supply locus. The first control circuit generates an output signal at an output locus when the supply voltage decreases below the predetermined value. (b) A second control circuit coupled with the output locus and coupled with the amplifier device. The second control circuit effects the compensating in response to the output signal.

20 Claims, 4 Drawing Sheets

APPARATUS AND METHOD FOR COMPENSATING OPERATING CURRENT IN AN AMPLIFIER WHEN SUPPLY VOLTAGE VARIES

BACKGROUND OF THE INVENTION

The present invention is directed to signal amplifier devices, and especially to differential signal amplifier devices. Supply voltages in amplifier devices are decreasing as efforts to create products having lower power requirements continue. Lower power requirements contribute to longer battery life, less heat generation and other advantages that are particularly useful in small, compact products. Differential signal amplifiers are experiencing a trend toward lower supply voltages, especially as differential signal amplifiers are increasingly manufactured to meet the Low Voltage Differential Signaling (LVDS) and Low Voltage Positive Emitter Coupled Logic (LVPECL) standards. Performance of amplifier devices, including LVDS and LVPECL amplifiers exhibits significant variation in various operational parameters as supply voltage varies.

If a particular amplifier is employed using a variety of supply voltages, there may be unacceptable variance in such operational parameters as gain, output voltage (e.g., output differential voltage, $V_{od}$, in LVDS and LVPECL amplifiers), and edge rate (a measure of definition of a signal edge). By way of example and not by way of limitation, as supply voltage drops, bias current drops. As a consequence of lower bias current, gain drops, $V_{od}$ is reduced and speed is reduced. As gain is reduced, edge rate deteriorates.

There is a need for an apparatus and method to operate an amplifier device at substantially constant operational parameters over a range of supply voltages. In particular, there is a need for an apparatus and method for compensating operating current in an amplifier when supply voltage varies.

SUMMARY OF THE INVENTION

An apparatus for compensating operating current in an amplifier device when supply voltage to the amplifier device decreases below a predetermined value at an input voltage supply locus includes: (a) A first control circuit coupled with the input voltage supply locus. The first control circuit generates an output signal at an output locus when the supply voltage decreases below the predetermined value. (b) A second control circuit coupled with the output locus and coupled with the amplifier device. The second control circuit effects the compensating in response to the output signal.

A method for compensating operating current in an amplifier device when supply voltage to the amplifier device decreases below a predetermined value at an input voltage supply locus includes the steps of: (a) In no particular order: (1) providing a first control circuit coupled with the input voltage supply locus; and (2) providing a second control circuit coupled with the first control circuit and coupled with the amplifier device. (b) Operating the first control circuit to generate an output signal when the supply voltage decreases below the predetermined value. (c) Operating the second control circuit to effect the compensating in response to the output signal.

It is, therefore, an object of the present invention to provide an apparatus and method to operate an amplifier device at substantially constant operational parameters over a range of supply voltages.

It is further object of the present invention to provide an apparatus and method for compensating operating current in an amplifier when supply voltage varies.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
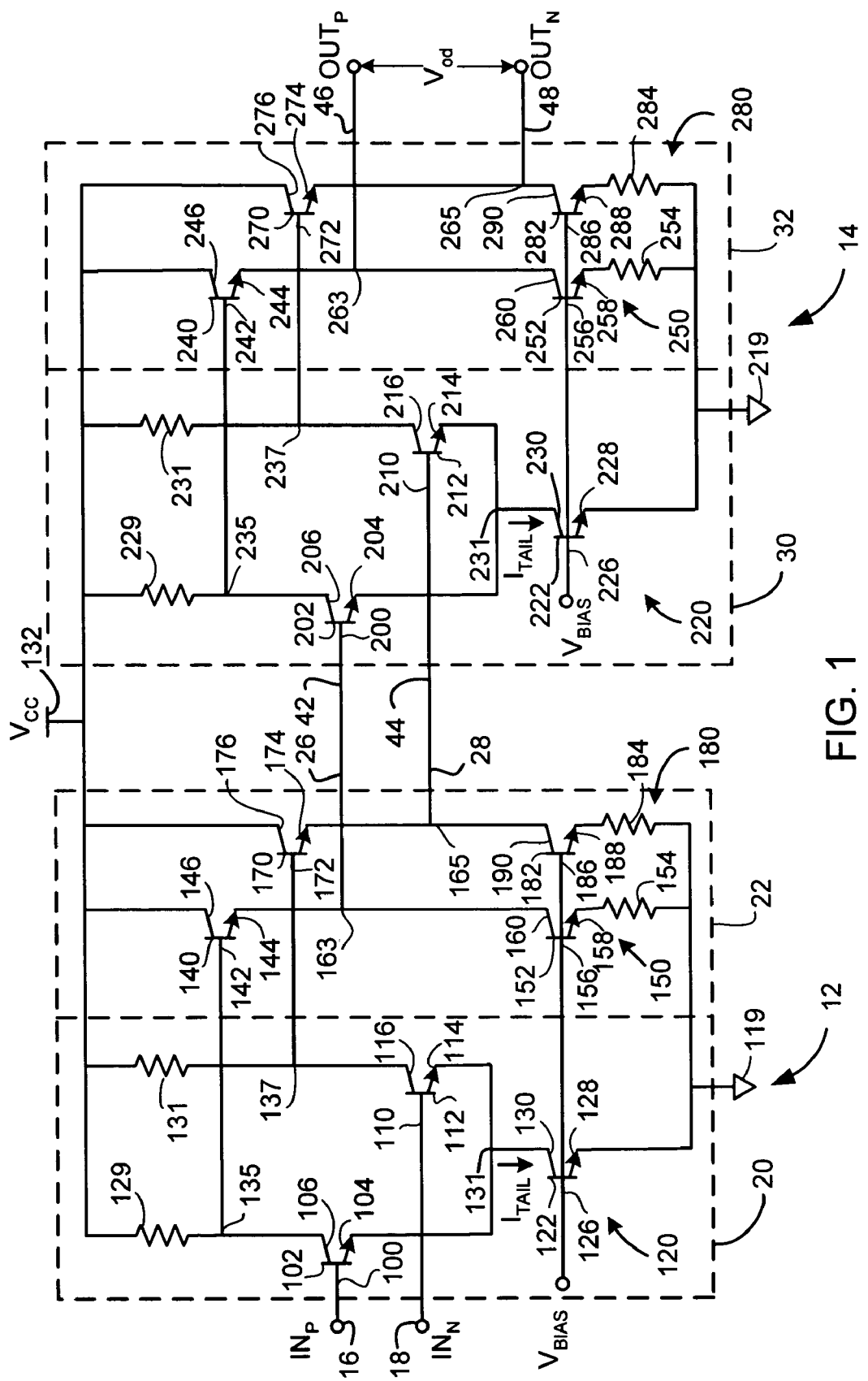
FIG. 1 is an electrical schematic diagram of a prior art differential signal amplifier.

FIG. 1 is an electrical schematic diagram of a prior art differential signal amplifier. In FIG. 1, a differential signal amplifier 10 has a first stage 12 and a second stage 14. First stage 12 includes a first amplifier stage 20 and a first level shift circuit 22. Second stage 14 includes a second amplifier stage 30 and a second level shift circuit 32.

First stage 12 receives a positive input signal $IN_P$ at input locus 16 and receives a negative input signal $IN_N$ at input locus 18. Input locus 16 is coupled with a base 100 of an NPN transistor 102. Transistor 102 has an emitter 104 and a collector 106. Input locus 18 is coupled with a base 110 of an NPN transistor 112. Transistor 112 has an emitter 114 and a collector 116. Emitters 104, 114 are coupled with ground 119 via a bias circuit 120. Bias circuit 120 includes an NPN transistor 122. Transistor 122 has a base 126, an emitter 128 and a collector 130. Collector 130 is coupled with emitters 104, 114. Emitter 128 is coupled with ground 119. A bias voltage $V_{BIAS}$ is applied to base 126 to control conducting operation by transistor 122. Collectors 106, 116 are coupled with an input voltage supply locus 132 via resistors 129, 131.

A follower transistor 140 has a base 142, an emitter 144 and a collector 146. Base 142 is coupled with a connection locus 135 between collector 106 and resistor 129. Collector 146 is coupled with supply voltage $V_{CC}$ at input voltage supply locus 132. Emitter 144 is coupled with ground 119 via a bias circuit 150. Bias circuit 150 includes an NPN transistor 152 and a resistor 154 coupled in series. Transistor 152 has a base 156, an emitter 158 and a collector 160. Collector 160 is coupled with emitter 144. Emitter 158 is coupled with resistor 154. A bias voltage $V_{BIAS}$ is applied to base 156 to control conducting operation by transistor 152.

A follower transistor 170 has a base 172, an emitter 174 and a collector 176. Base 172 is coupled with a connection locus 137 between collector 116 and resistor 131. Collector 176 is coupled with supply voltage $V_{CC}$ at input voltage supply locus 132. Emitter 174 is coupled with ground 119 via a bias circuit 180. Bias circuit 180 includes an NPN transistor 182 and a resistor 184 coupled in series. Transistor 182 has a base 186, an emitter 188 and a collector 190. Collector 190 is coupled with emitter 174. Emitter 188 is coupled with resistor 184. A bias voltage $V_{BIAS}$ is applied to base 186 to control conducting operation by transistor 182. Output locus 26 is coupled with a connection locus 163 between collector 160 and emitter 144. Output locus 28 is coupled with a connection locus 165 between collector 190 and emitter 174.

Second stage 14 receives a first input signal from output locus 26 at input locus 42 and receives a second input signal from output locus 28 at input locus 44. Input locus 42 is coupled with a base 200 of an NPN transistor 202. Transistor 202 has an emitter 204 and a collector 206. Input locus 44 is coupled with a base 210 of an NPN transistor 212. Transistor 212 has an emitter 214 and a collector 216. Emitters 204, 214 are coupled with ground 219 via a bias circuit 220. Bias circuit 220 includes an NPN transistor 222. Transistor 222 has a base 226, an emitter 228 and a collector 230. Collector 230 is coupled with emitters 204, 214. Emitter 228 is coupled with ground 219. A bias voltage $V_{BIAS}$ is applied to base 226 to control conducting operation by transistor 222. Collectors 206, 216 are coupled with input voltage supply locus 132 via resistors 229, 231.

A follower transistor 240 has a base 242, an emitter 244 and a collector 246. Base 242 is coupled with a connection locus 235 between collector 206 and resistor 229. Collector 246 is coupled with supply voltage $V_{CC}$ at input voltage supply locus 132. Emitter 244 is coupled with ground 219 via a bias circuit 250. Bias circuit 250 includes an NPN transistor 252 and a resistor 254 coupled in series. Transistor 252 has a base 256, an emitter 258 and a collector 260. Collector 260 is coupled with emitter 244. Emitter 258 is coupled with resistor 254. A bias voltage $V_{BIAS}$ is applied to base 256 to control conducting operation by transistor 252.

A follower transistor 270 has a base 272, an emitter 274 and a collector 276. Base 272 is coupled with a connection locus 237 between collector 216 and resistor 231. Collector 276 is coupled with supply voltage $V_{CC}$ at input voltage supply locus 132. Emitter 274 is coupled with ground 219 via a bias circuit 280. Bias circuit 280 includes an NPN transistor 282 and a resistor 284 coupled in series. Transistor 282 has a base 286, an emitter 288 and a collector 290. Collector 290 is coupled with emitter 274. Emitter 288 is coupled with resistor 284. A bias voltage $V_{BIAS}$ is applied to base 286 to control conducting operation by transistor 282.

Output locus 46 is coupled with a connection locus 263 between collector 260 and emitter 244. Output locus 48 is coupled with a connection locus 265 between collector 290 and emitter 274. Output signal $OUT_P$ is presented at output locus 46. Output signal $OUT_N$ is presented at output locus 48. The potential difference between output loci 46, 48 is differential output voltage $V_{od}$.

Gain of first amplifier stage 20 is generally directly variable with respect to tail current $I_{TAIL}$ that traverses transistors 102, 112. Differential output voltage $V_{od}$ and speed of first amplifier stage 20 are also directly variable with respect to tail current $I_{TAIL}$. Tail current $I_{TAIL}$ may also be viewed as the bias current that traverses bias transistor 122. When supply voltage $V_{CC}$ drops to a sufficiently low level, bias transistor 122 saturates and consequently current $I_{TAIL}$ through transistors 102, 112 is reduced. When tail current $I_{TAIL}$ at locus 131 in first amplifier stage 20 goes down, gain goes down, differential output voltage $V_{od}$ goes down and speed of first amplifier stage 20 goes down.

This effect is also manifested in second amplifier stage 30. Gain of second amplifier stage 30 is generally directly variable with respect to tail current $I_{TAIL}$ that traverses transistors 202, 212. Differential output voltage $V_{od}$ and speed of second amplifier stage 30 are also directly variable with respect to tail current $I_{TAIL}$. Tail current $I_{TAIL}$ may also be viewed as the bias current that traverses bias transistor 222. When supply voltage $V_{CC}$ drops to a sufficiently low level, bias transistor 222 saturates and consequently current $I_{TAIL}$ through transistors 202, 212 is reduced. When tail current $I_{TAIL}$ at locus 231 in second amplifier stage 30 goes down, gain goes down, differential output voltage $V_{od}$ goes down and speed of second amplifier stage 30 goes down.

Expressed in mathematical format:

$$\text{Gain} \sim I_{TAIL} \quad [1]$$

$$V_{od} \sim I_{TAIL} \quad [2]$$

When gain is low, the output signals at output loci 46, 48 exhibit a less-defined edge than is presented when gain is high. Also, as mentioned earlier herein, speed is reduced as supply voltage $V_{CC}$ is reduced. Speed reduction occurs because a lower supply voltage $V_{CC}$ causes a lower tail current $I_{TAIL}$ so that there is a lower current density in transistors 102, 112 (first amplifier stage 20) and in transistors 202, 212 (second amplifier stage 30). The speed of transistors is only optimized with a certain optimized current density. Lower tail Current $I_{TAIL}$ reducing current density to less than the optimized current density is manifested in a lower speed of operation.

Figure 2:
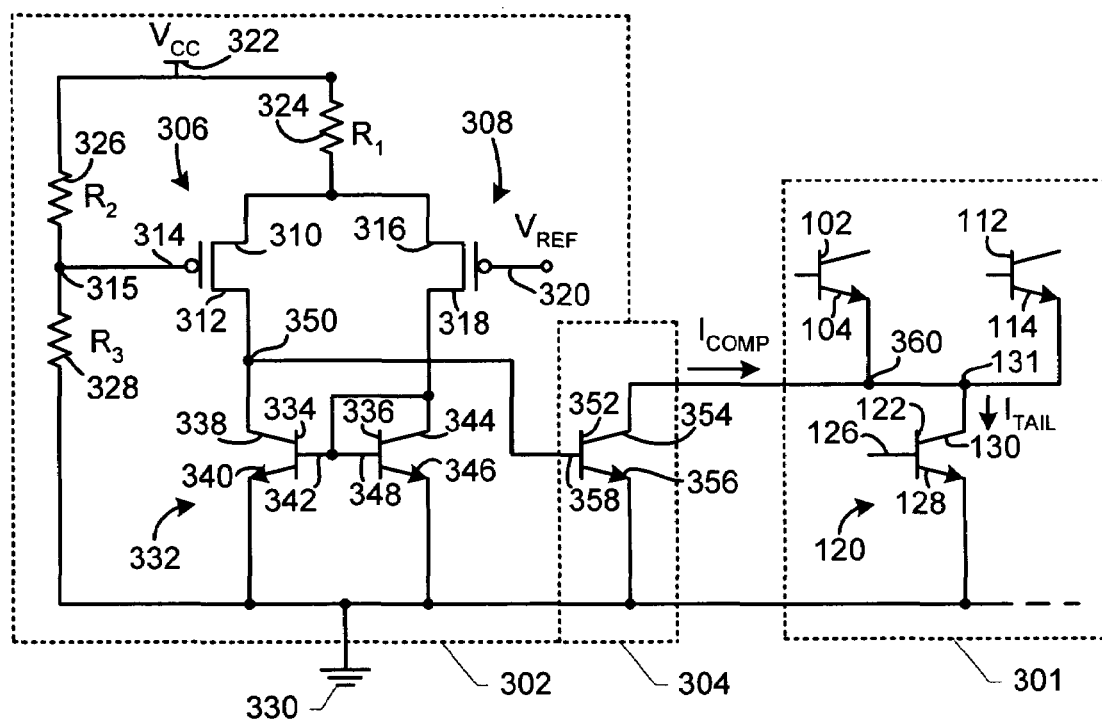
FIG. 2 is an electrical schematic diagram of the preferred embodiment of the apparatus of the present invention.

FIG. 2 is an electrical schematic diagram of the preferred embodiment of the apparatus of the present invention. In FIG. 2, an apparatus 300 includes a first control circuit 302 and a second control circuit 304. Apparatus 300 is configured for controlling operation of an amplifier device 301. Only a representative portion of amplifier 301 is shown in FIG. 2. Apparatus 300 effects controlling operation of amplifier device 301 by compensating operating current in amplifier device 301. First control circuit 302 includes PMOS transistors 306, 308 coupled in parallel. Transistor 306 has a source 310, a drain 312 and a gate 314. Transistor 308 has a source 316, a drain 318 and a gate 320. Transistors 306, 308 are coupled with an input voltage supply locus 322 via a resistor 324. A supply voltage signal $V_{CC}$ is applied at input voltage supply locus 322. Resistor 324 has a value $R_1$. Drains 312, 318 are coupled with a ground locus 330 via a current mirror device 332. Current mirror device 332 includes bipolar transistors 334, 336. Transistor 334 has a collector 338, an emitter 340 and a base 342. Transistor 336 has a collector 344, an emitter 346 and a base 348. Emitters 340, 346 are coupled with ground locus 330. Bases 342, 348 are coupled with collector 344 to establish transistor 336 in a diode-connected configuration.

Resistors 326, 328 are connected in series between input voltage supply locus 322 and ground locus 330. Resistor 326 has a value $R_2$. Resistor 328 has a value $R_3$. Gate 320 receives a reference voltage signal $V_{REF}$. Gate 314 is coupled with a connection locus 315 between resistors 326, 328. An output locus 350 is located at drain 312 and is coupled with second control circuit 304.

Second control circuit 304 includes a bipolar transistor 352. Transistor 352 has a collector 354, an emitter 356 and a base 358. Base 358 is coupled with output locus 350. Emitter 356 is coupled with ground locus 330. Collector 354 is coupled with amplifier device 301.

The portion of amplifier device 301 illustrated in FIG. 2 represents a pertinent portion of first amplifier stage 20 of differential signal amplifier 10 (FIG. 1) by way of illustration and not by way of limitation. Amplifier device 301 includes transistor 102 having an emitter 104 and transistor 112 having an emitter 114. Emitters 104, 114 are coupled with ground locus 330 via bias circuit 120. Bias circuit 120 includes NPN transistor 122. Transistor 122 has base 126, emitter 128 and collector 130. Collector 130 is coupled with emitters 104, 114. Emitter 128 is coupled with ground locus 330. A bias voltage $V_{BIAS}$ is applied to base 126 to control conducting operation by transistor 122. Tail current $I_{TAIL}$ flows from emitters 104, 114 and is present at collector 130. As described earlier herein with regard to FIG. 1, when supply voltage $V_{CC}$ at input voltage supply locus 132 (FIG. 1) is reduced, $I_{TAIL}$ goes down.

Gain of first amplifier stage 20 is generally directly variable with respect to tail current $I_{TAIL}$ that traverses transistors 102, 112. Differential output voltage $V_{od}$ and speed of first amplifier stage 20 are also directly variable with respect to tail current $I_{TAIL}$. Tail current $I_{TAIL}$ may also be viewed as the operational current for first amplifier stage 20 or as the bias current that traverses bias transistor 122. When supply voltage $V_{CC}$ drops to a sufficiently low level, bias transistor 122 saturates and consequently current $I_{TAIL}$ through transistors 102, 112 is reduced. When tail current $I_{TAIL}$ at locus 131 in first amplifier stage 20 goes down, gain goes down, differential output voltage $V_{od}$ goes down and speed of first amplifier stage 20 goes down.

First control circuit 302 monitors supply voltage $V_{CC}$ and compensates for reductions in supply voltage $V_{CC}$ by providing a compensating current $I_{COMP}$ to locus 360 in amplifier device 301 to supplement tail current $I_{TAIL}$. Supplementing tail current $I_{TAIL}$ using compensating current $I_{COMP}$ when $V_{CC}$ drops reduces the effects of reduced tail current $I_{TAIL}$ described above (i.e., reduced, gain, reduced $V_{od}$, reduced speed and degraded edge rate) and effects control of operation of amplifier device 301.

Resistors 326, 328 establish a voltage divider circuit. If resistor values $R_2$, $R_3$ of resistors 326, 328 are equal, then signals appearing at locus 315 are equal to $$\frac{V_{CC}}{2}.$$

If $$\frac{V_{CC}}{2} > V_{REF} \Rightarrow \text{transistor 308}$$

is on and transistor 306 is off. In such a configuration, the base-to-emitter voltage $V_{BE}$ of transistor 352 will remain too low to turn on transistor 352 (so long as reference voltage $V_{REF}$ is selected properly).

If $$\frac{V_{CC}}{2} < V_{REF} \Rightarrow \text{transistor 306}$$

is on and transistor 308 is off. In such a configuration, the base-to-emitter voltage $V_{BE}$ of transistor 352 will rise sufficiently to turn on transistor 352 (so long as reference voltage $V_{REF}$ is selected properly). When transistor 352 is turned on, compensating current $I_{COMP}$ flows to locus 360 in amplifier device 301 to be added to tail current $I_{TAIL}$ (i.e., to supplement tail current $I_{TAIL}$) in amplifier device 301. Increasing tail current $I_{TAIL}$ (i.e., supplementing tail current $I_{TAIL}$ with compensating current $I_{COMP}$) compensates lowering of operating current in amplifier device 301 that occurs because of reduction in supply voltage $V_{CC}$.

Control of operation of amplifier device 301 is achieved when a reduction of supply voltage $V_{CC}$ is sensed by first control circuit 302. First control circuit 302 operates to compare $$V_{CC} \left( \text{actually}, \frac{V_{CC}}{2} \right)$$

with reference voltage $V_{REF}$. Preferably, reference voltage $V_{REF}$ is selected to remain substantially fixed over the entire supply voltage $V_{CC}$ range of operation of apparatus 300. First control circuit 301 responds when that comparison indicates that supply voltage $V_{CC}$ drops below a predetermined value by generating an output signal at output locus 350. Second control circuit 304 responds to the output signal at output locus 350. When the output signal at output locus 350 reaches a predetermined value, second control circuit 304 injects compensating current $I_{COMP}$ into amplifier device 301 at locus 360 to control operation of amplifier device 301 by supplementing tail current $I_{TAIL}$ with compensating current $I_{COMP}$.

Figure 3:
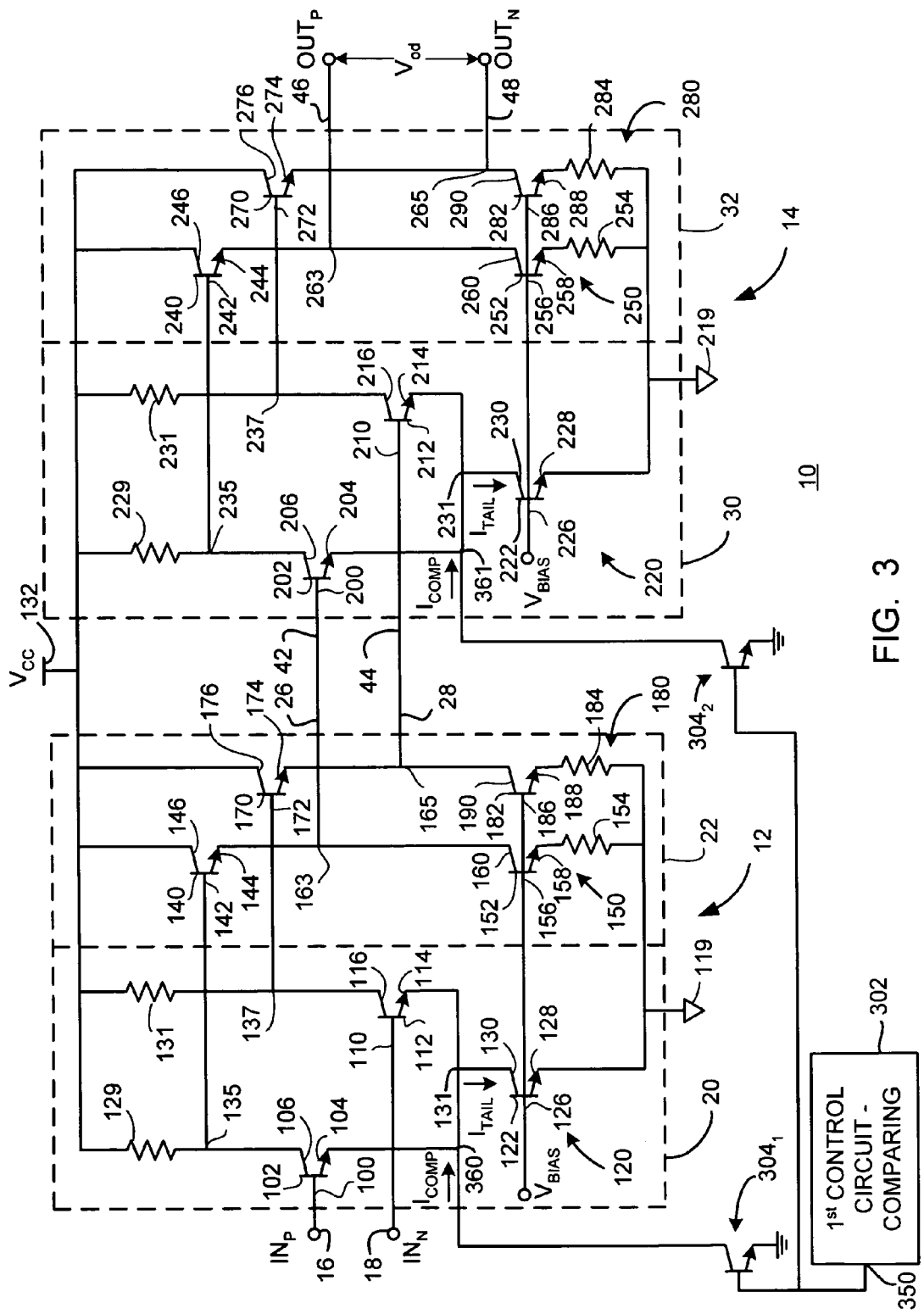
FIG. 3 is an electrical schematic diagram of the apparatus of the present invention employed with a two-stage differential signal amplifier.

FIG. 3 is an electrical schematic diagram of the apparatus of the present invention employed with a two-stage differential signal amplifier. In FIG. 3, differential signal amplifier 10 (FIG. 1) is reproduced in its entirety. In order to avoid prolixity a detailed description of amplifier 10 will not be repeated here. A first control circuit 302 (described in detail in FIG. 2) is coupled with a second control circuit $304_1$ (described in detail in FIG. 2) associated with first amplifier stage 20. First control circuit 302 is also coupled with a second control circuit $304_2$ (described in detail in FIG. 2) associated with second amplifier stage 30. First control circuit 302 carries out a comparing function described with regard to FIG. 2 to ascertain when supply voltage $V_{CC}$ drops below a predetermined level. When supply voltage $V_{CC}$ drops below the predetermined level, an output signal is presented at output locus 350. Second control circuits $304_1$, $304_2$ are coupled with output locus 350. The output signal presented at output locus 350 is sufficient to turn on second control circuits $304_1$, $304_2$ and second control circuits $304_1$, $304_2$ respond by providing a compensating current $I_{COMP}$. Second control circuit $304_1$ provides compensating current $I_{COMP}$ to first amplifier stage 20 at a circuit locus 360 to compensate for reduced tail current $I_{TAIL}$ that results in first amplifier stage 20 from decreased supply voltage $V_{CC}$. Second control circuit $304_2$ provides compensating current $I_{COMP}$ to second amplifier stage 30 at a circuit locus 361 to compensate for reduced tail current $I_{TAIL}$ that results in second amplifier stage 30 from decreased supply voltage $V_{CC}$. Additional amplifier stages (not shown in FIG. 3) may be provided with individual additional second control circuits $302_n$ as necessary to compensate all amplifier stages of an amplifier device.

Figure 4:
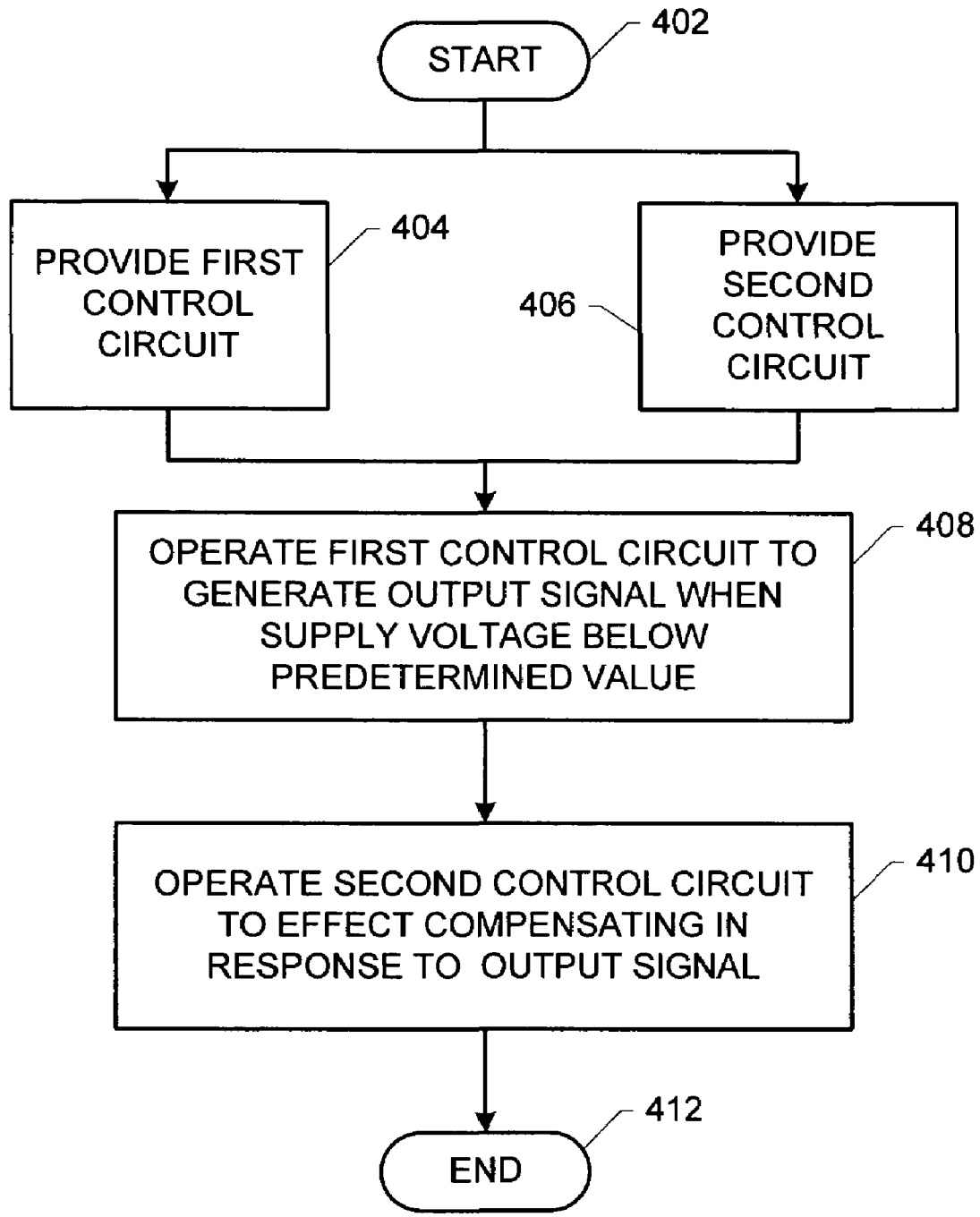
FIG. 4 is a flow chart illustrating the method of the present invention.

FIG. 4 is a flow chart illustrating the method of the present invention. In FIG. 4, a method 400 for compensating operating current in an amplifier device when supply voltage to the amplifier device decreases below a predetermined value at an input voltage supply locus begins at a START locus 402. Method 400 continues with the step of: in no particular order: (1) providing a first control circuit coupled with the input voltage supply locus, as indicated by a block 404, and (2) providing a second control circuit coupled with the first control circuit and coupled with the amplifier device, as indicated by a block 406.

Method 400 continues with the step of operating the first control circuit to generate an output signal when the supply voltage decreases below the predetermined value, as indicated by a block 408.

Method 400 continues with the step of operating the second control circuit to effect the compensating in response to the output signal, as indicated by a block 410. Method 400 terminates at an END locus 412.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

We claim:

1. An apparatus for controlling operation of an amplifier device when supply voltage provided to said amplifier device varies at an input voltage supply locus; said amplifier device having an operating current varying in generally direct proportion with said supply voltage; the apparatus controlling provision of a compensating current to said amplifier device to counter said varying; the apparatus comprising:
   (a) a comparing circuit coupled with said input voltage supply locus and coupled with a reference input locus; said comparing circuit effecting comparison of signals received at said input voltage supply locus with signals received at said reference input locus; said comparing circuit generating an output signal at an output locus; said output signal indicating said comparison; and
   (b) an output circuit coupled with said output locus and coupled with said amplifier device; said output circuit generating said compensating current when said output signal has a predetermined value.

2. An apparatus for controlling operation of an amplifier device when supply voltage provided to said amplifier device varies at an input voltage supply locus as recited in claim 1 wherein said comparing circuit comprises a first switch component and a second switch component; said first switch component being coupled to respond to said signals received at said input voltage supply locus; said second switch component being coupled to respond to said signals received at said reference input locus; at least one of said first switch component and said second switch component being coupled with said output locus.

3. An apparatus for controlling operation of an amplifier device when supply voltage provided to said amplifier device varies at an input voltage supply locus as recited in claim 2 wherein said output circuit comprises a third switch component responsive to said output signal.

4. An apparatus for controlling operation of an amplifier device when supply voltage provided to said amplifier device varies at an input voltage supply locus as recited in claim 1 wherein said amplifier device is a differential signal amplifier device including two parallel networks handling substantially complementary differential signals; said two networks being coupled with said input voltage supply locus and contributing to said operating current at a common locus.

5. An apparatus for controlling operation of an amplifier device when supply voltage provided to said amplifier device varies at an input voltage supply locus as recited in claim 4 wherein said comparing circuit comprises a first switch component and a second switch component; said first switch component being coupled to respond to said signals received at said input voltage supply locus; said second switch component being coupled to respond to said signals received at said reference input locus; at least one of said first switch component and said second switch component being coupled with said output locus.

6. An apparatus for controlling operation of an amplifier device when supply voltage provided to said amplifier device varies at an input voltage supply locus as recited in claim 5 wherein said output circuit comprises a third switch component responsive to said output signal.

7. An apparatus for controlling operation of an amplifier device when supply voltage provided to said amplifier device varies at an input voltage supply locus as recited in claim 1 wherein said amplifier device comprises a plurality of amplifier units.

8. An apparatus for controlling operation of an amplifier device when supply voltage provided to said amplifier device varies at an input voltage supply locus as recited in claim 7 wherein said comparing circuit comprises a first switch component and a second switch component; said first switch component being coupled to respond to said signals received at said input voltage supply locus; said second switch component being coupled to respond to said signals received at said reference input locus; at least one of said first switch component and said second switch component being coupled with said output locus.

9. An apparatus for controlling operation of an amplifier device when supply voltage provided to said amplifier device varies at an input voltage supply locus as recited in claim 8 wherein said output circuit comprises a plurality of third switch components; each respective third switch component of said plurality of third switch components being coupled with a respective amplifier unit of said plurality of amplifier units; each said respective third switch component being responsive to said output signal.

10. An apparatus for controlling operation of an amplifier device when supply voltage provided to said amplifier device varies at an input voltage supply locus as recited in claim 7 wherein each respective amplifier unit of said plurality of amplifier units is a differential signal amplifier unit including two parallel networks handling substantially complementary differential signals; said two networks being coupled with said input voltage supply locus and contributing to said operating current at a common locus.

11. An apparatus for controlling operation of an amplifier device when supply voltage provided to said amplifier device varies at an input voltage supply locus as recited in claim 10 wherein said output circuit comprises a plurality of third switch components; each respective third switch component of said plurality of third switch components being coupled with a respective said amplifier unit; each said respective third switch component being responsive to said output signal.

12. An apparatus for compensating operating current in an amplifier device when supply voltage to said amplifier device decreases below a predetermined value at an input voltage supply locus; the apparatus comprising:
   (a) a first control circuit coupled with said input voltage supply locus; said first control circuit generating an output signal at an output locus when said supply voltage decreases below said predetermined value; and
   (b) a second control circuit coupled with said output locus and coupled with said amplifier device; said second control circuit effecting said compensating in response to said output signal.

13. An apparatus for compensating operating current in an amplifier device when supply voltage to said amplifier device decreases below a predetermined value at an input voltage supply locus as recited in claim 12 wherein said amplifier device is a differential signal amplifier device including two parallel substantially similar networks handling substantially complementary differential signals; said two networks being coupled with said input voltage supply locus and contributing to said operating current at a common locus.

14. An apparatus for compensating operating current in an amplifier device when supply voltage to said amplifier device decreases below a predetermined value at an input voltage supply locus as recited in claim 13 wherein said first control circuit comprises a first switch component and a second switch component; said first switch component being coupled to respond to signals received at said input voltage supply locus; said second switch component being coupled to respond to signals received at a reference input locus; at least one of said first switch component and said second switch component being coupled with said output locus.

15. An apparatus for compensating operating current in an amplifier device when supply voltage to said amplifier device decreases below a predetermined value at an input voltage supply locus as recited in claim 14 wherein said second control circuit comprises a third switch component responsive to said output signal.

16. An apparatus for compensating operating current in an amplifier device when supply voltage to said amplifier device decreases below a predetermined value at an input voltage supply locus as recited in claim 12 wherein said amplifier device comprises a plurality of amplifier units.

17. An apparatus for compensating operating current in an amplifier device when supply voltage to said amplifier device decreases below a predetermined value at an input voltage supply locus as recited in claim 16 wherein said first control circuit comprises a first switch component and a second switch component; said first switch component being coupled to respond to signals received at said input voltage supply locus; said second switch component being coupled to respond to signals received at a reference input locus; at least one of said first switch component and said second switch component being coupled with said output locus.

18. An apparatus for compensating operating current in an amplifier device when supply voltage to said amplifier device decreases below a predetermined value at an input voltage supply locus as recited in claim 17 wherein said second control circuit comprises a plurality of third switch components; each respective third switch component of said plurality of third switch components being coupled with a respective amplifier unit of said plurality of amplifier units; each said respective third switch component being responsive to said output signal.

19. A method for compensating operating current in an amplifier device when supply voltage to said amplifier device decreases below a predetermined value at an input voltage supply locus; the method comprising the steps of:
(a) in no particular order:
(1) providing a first control circuit coupled with said input voltage supply locus; and
(2) providing a second control circuit coupled with said first control circuit and coupled with said amplifier device;
(b) operating said first control circuit to generate an output signal when said supply voltage decreases below said predetermined value; and
(c) operating said second control circuit to effect said compensating in response to said output signal.

20. A method for compensating operating current in an amplifier device when supply voltage to said amplifier device decreases below a predetermined value at an input voltage supply locus as recited in claim 19 wherein said amplifier device comprises a plurality of amplifier units.

* * * * *